United States Patent [19]
Small

[11] Patent Number: 5,491,426
[45] Date of Patent: Feb. 13, 1996

[54] ADAPTABLE WAFER PROBE ASSEMBLY FOR TESTING ICS WITH DIFFERENT POWER/GROUND BOND PAD CONFIGURATIONS

[75] Inventor: Gary L. Small, Los Gatos, Calif.

[73] Assignee: VLSI Technology, Inc., San Jose, Calif.

[21] Appl. No.: 269,798

[22] Filed: Jun. 30, 1994

[51] Int. Cl.$^6$ ..................................................... G01R 1/02
[52] U.S. Cl. ........................................ 324/754; 324/72.5
[58] Field of Search .................................. 324/754, 72.5, 324/755, 765, 158.1, 762; 439/482, 824, 481

[56] References Cited

U.S. PATENT DOCUMENTS

| | | | |
|---|---|---|---|
| 3,963,986 | 6/1976 | Morton et al. | 324/765 |
| 4,038,599 | 7/1977 | Bove et al. | 324/754 |
| 4,488,111 | 12/1984 | Widdowson | 324/762 |
| 4,780,670 | 10/1988 | Cherry | 324/754 |
| 4,782,289 | 11/1988 | Schwar et al. | 324/754 |
| 4,899,099 | 2/1990 | Mendenhall et al. | 324/754 |

*Primary Examiner*—Vinh P. Nguyen
*Attorney, Agent, or Firm*—Majestic, Parson, Siebert & Hsue

[57] ABSTRACT

An adaptable probe card assembly for testing an IC die includes a probe card and a decoupling apparatus selectably mounted on the probe card. A different decoupling apparatus is used for each IC die to be tested having a different power and ground bond pad configuration. Each decoupling apparatus includes a conductive ground bus connected to ground, a nonconductive support structure, and a plurality of chip capacitors sandwiched between the conductive ground bus and nonconductive support structure in such positions that they are each connected at one end to the ground bus and at another end to one of the power or ground bond pads of the IC die being tested via a conductive contact extending through a hole in the nonconductive support structure down to a signal contact formed on the probe card, which signal contact is in turn, connected to a needle making touch contact with the appropriate power or ground bond pad of the IC die being tested.

7 Claims, 5 Drawing Sheets

| 1 | P |
|---|---|
| 2 | S |
| 3 | S |
| 4 | S |
| 5 | G |
| 6 | S |
| 7 | S |
| 8 | S |
| 9 | P |
| 10 | S |
| 11 | S |
| 12 | S |
| 13 | G |
| 14 | S |
| 15 | S |
| 16 | S |

| 1 | G |
|---|---|
| 2 | S |
| 3 | S |
| 4 | S |
| 5 | P |
| 6 | S |
| 7 | S |
| 8 | S |
| 9 | G |
| 10 | S |
| 11 | S |
| 12 | S |
| 13 | P |
| 14 | S |
| 15 | S |
| 16 | S |

| 1 | S |
|---|---|
| 2 | S |
| 3 | P |
| 4 | S |
| 5 | S |
| 6 | S |
| 7 | G |
| 8 | S |
| 9 | S |
| 10 | S |
| 11 | P |
| 12 | S |
| 13 | S |
| 14 | S |
| 15 | G |
| 16 | S |

5,491,426

ADAPTABLE WAFER PROBE ASSEMBLY FOR TESTING ICS WITH DIFFERENT POWER/GROUND BOND PAD CONFIGURATIONS

BACKGROUND OF THE INVENTION

This invention relates in general to integrated circuit ("IC") test systems and in particular, to an adaptable wafer probe assembly for testing a variety of ICs having different power and/or ground bond pad configurations.

Integrated circuits, especially those of the so-called application specific type, may have any one of a number of different power and/or ground bond pad configurations. FIG. 1A illustrates, as a simplified example, a top plan view of one such IC die 100, wherein bond pads 1–16 provide external device electrical connection means to the active circuitry 50 of the IC die 100. Depending upon the functionality and layout of the active circuitry 50, some of the bond pads will be assigned by the layout designer to communicate input and/or output signals "S" to and/or from the active circuitry 50, at least one bond pad will be assigned to provide power "P" to the active circuitry 50, and at least one bond pad will be assigned to provide an external ground connection "G" for the active circuitry 50.

FIGS. 1B–1D illustrate examples of such possible bond pad assignments (also referred to herein as "configurations") for the IC die example of FIG. 1A. FIG. 1B illustrates one example where opposing corner bond pads 1 and 9 are assigned to be power "P" bond pads, opposing corner bond pads 5 and 13 are assigned to be ground "G" bond pads, and the remaining bond pads are assigned to be input and/or output signal "S" bond pads; FIG. 1C illustrates a second example where the power "P" and ground "G" bond pad assignments have been reversed; and FIG. 1D illustrates a third example where the power "P" and ground "G" bond pad assignments are not in the corner bond pads.

When testing the integrated circuit die 100, it is desirable to minimize the noise level (also referred to as "bounce") on the power and ground lines to the IC die 100. FIGS. 2A and 2B illustrate, as examples, circuits for reducing such noise on the power and ground lines, PL and GL, respectively, wherein in FIG. 2A, a voltage source Vdd is shown providing power over power line PL to the IC die 100 at bond pad P, and in FIG. 2b, a ground reference GND' is shown being provided over ground line GL to the IC die 100 at bond pad G. To prevent noise generated on the power and ground lines, PL and GL, respectively, from entering and affecting the proper operation of IC die 100, decoupling capacitors 20 and 22 are respectively connected at nodes 24 and 26 to the power and ground lines PL and GL, thereby shunting noise generated on these lines to ground GND.

As a practical matter, however, some of the noise generated on the power and ground lines, PL and GL, respectively, will still enter the IC die 100. For example, noise generated between node 24 and bond pad P on the power line PL will not be filtered out by decoupling capacitor 20, and noise generated between node 26 and bond pad G on the ground line GL will not be filtered out by decoupling capacitor 22. Accordingly, to minimize such noise, it is preferable to connect decoupling capacitors 20 and 22 as close as possible to bond pads P and G, respectively.

SUMMARY OF THE INVENTION

Accordingly, one object of the present invention is to minimize the noise entering an IC under test from the power and ground lines connected to the IC.

Another object is to reduce the overall costs of test fixtures required for testing ICs having different power and/or ground bond pad configurations.

Still another object is to reduce the set-up times required for testing ICs having different power and/or ground bond pad configurations.

These and other objects are accomplished by the various aspects of the present invention, wherein briefly stated, one aspect is a probe card assembly useful for testing, in conjunction with an IC tester, a plurality of individual IC die having identical bond pad layouts, but different bond pad assignments. The probe card assembly includes a probe card and a decoupling apparatus adapted for mounting on the probe card. The probe card has a plurality of needles and a plurality of signal contacts, each needle contacting, according to the bond pad layout, a respective bond pad of an individual IC die being tested, and each signal contact connecting one of the needles to a respective one of the test channels, or power line, or ground line of the IC tester. The decoupling apparatus is a selected one of a plurality of decoupling apparatuses, each configured for a different bond pad assignment, wherein the selected one is configured for the bond pad assignment of the IC die being tested. The configuration of each decoupling apparatus includes a ground bus and at least one ground chip capacitor connected at one end to the ground bus and at another end to respective ones of the plurality of needles contacting at least one ground bond pad of the IC die being tested, and preferably, also includes at least one power chip capacitor connected at one end to the ground bus and at another end to respective ones of the plurality of needles contacting at least one power bond pad of the IC die being tested.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 3:
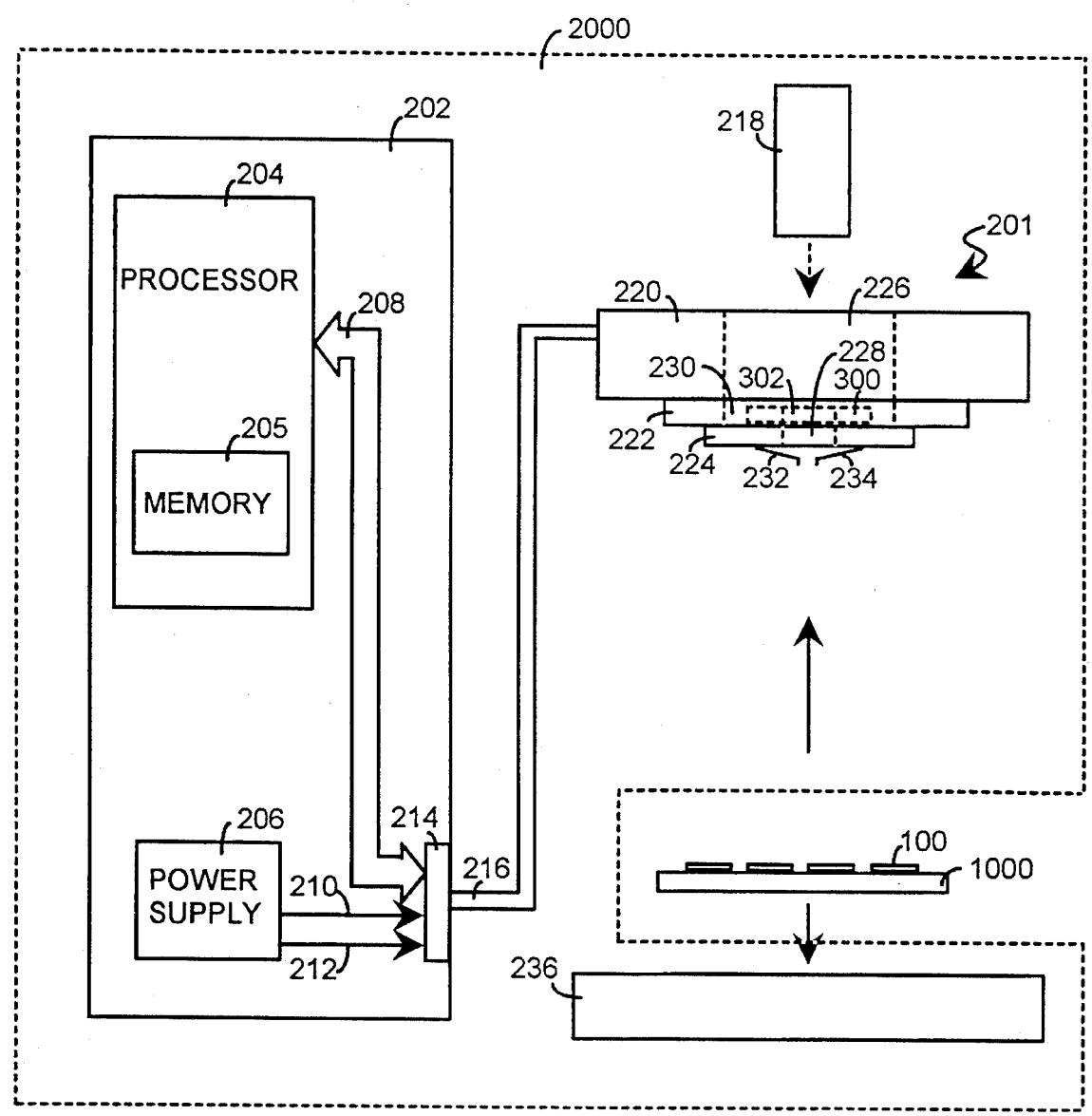
FIG. 3 illustrates a simplified example of an IC wafer probe test system utilizing aspects of the present invention.

FIG. 3 illustrates a test system 2000 for testing (also referred to herein as "wafer probing") a plurality of IC die (e.g., 100) formed on a silicon wafer 1000. Included in the IC test system 2000 are an X-Y-Z table 236 upon which the silicon wafer 1000 is placed, a test head assembly 201 which makes communication contact with a selected one of the plurality of IC die when testing the selected IC die, an optical alignment means 218 useful for aligning the silicon wafer 1000 with respect to the test head assembly 201 such that the selected IC die to be tested is properly positioned with respect to the test head assembly 201, and an IC tester 202 which provides stimuli and power to the selected IC die to be tested, and receives and analyzes the responses to such stimuli from the selected IC die.

Included in the IC tester 202 are a power supply 206 and processor 204. The power supply 206 provides power and a ground reference to the selected IC die through a power line 210 and a ground line 212, respectively. The processor 204 provides, in response to a test program stored in the processor's memory 205, the stimuli to test the selected IC die, and analyzes, also under the control of the test program stored in the processor's memory 205, the resulting responses from the selected IC die to determine whether the selected IC die is good or not. The processor 204 provides and receives such stimuli and responses over test channels 208. Generally, different IC designs are tested by different test programs so that when a different IC design is to be tested, a different test program is stored in the processor's memory 205.

The test head assembly 201 includes a test head 220, a load board 222, a probe card 224, and a decoupling apparatus 300. The test head 220 communicates with the IC tester 202 through a cable 216 which is attached by connector 214 to the IC tester 202. The test channels 208, the power line 210, and the ground line 212 are thus provided through cable 216 to the test head 220. The load board 222 is mounted on the test head 220 as an intermediary structure adapted to electrically connect the probe card 224 to the test head 220. Thereupon, by mounting the probe card 224 on the load board 222, each of a plurality of needles (e.g., 232 and 234) formed on the probe card 224 is electrically connected to either one of the test channels 208, the power line 210, or the ground line 212. Preferably before mounting the probe card 224 on the load board 222, however, the decoupling apparatus 300 is mounted on the probe card 224 such that the decoupling apparatus 300 will be positioned within a hole area 230 of the load board 222 when the probe card 224 is mounted on the load board 222.

Figure 4A:
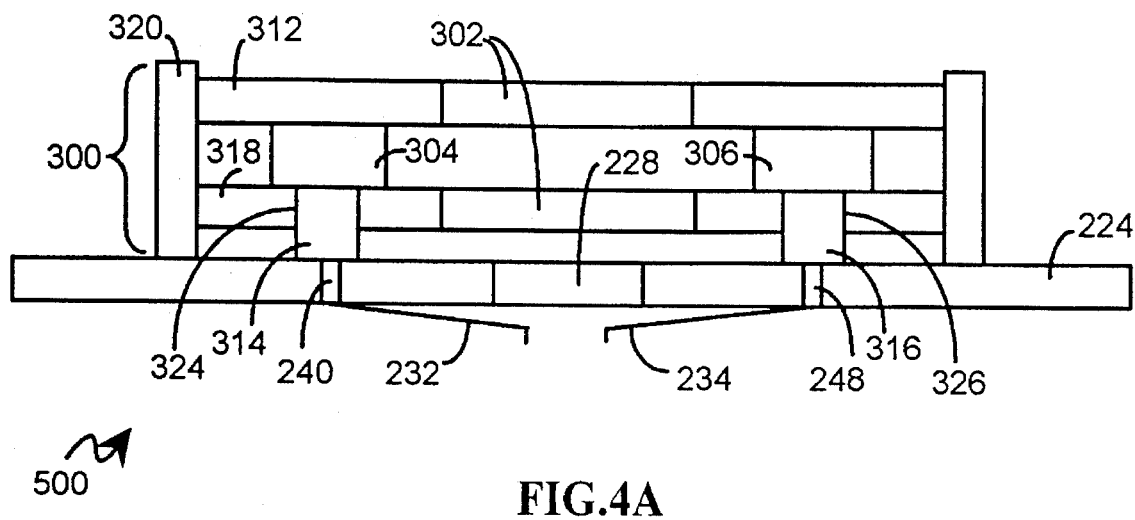
FIGS. 4A and 4B respectfully illustrate, as an example, a cross-sectional view and a top plan view of an adaptable wafer probe assembly utilizing aspects of the present invention.
Figure 4B:
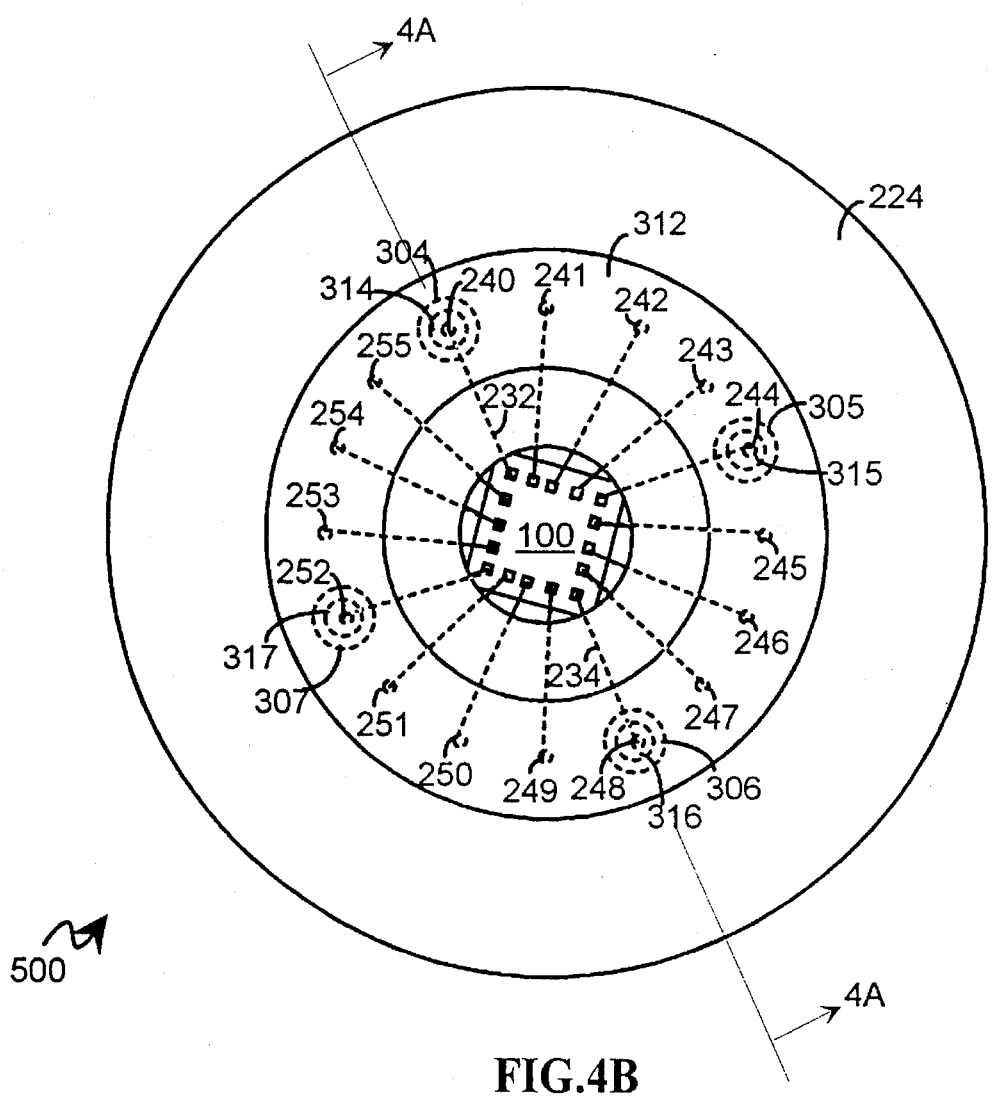

Referring to FIGS. 4A and 4B, cross-sectional and top plan views, respectively, of a probe card assembly 500 are illustrated. Included in the probe card assembly 500 are the probe card 224 and the decoupling apparatus 300. The probe card 224 is generally of conventional construction having a plurality of signal contacts 240–255 (shown as dotted circles in FIG. 4B) and a plurality of needles (shown as dotted lines in FIG. 4B). Each of the signal contacts 240–255 is connected to either one of the test channels 208, or the power line 210, or the ground line 212. Each of the needles is physically connected at one end to one of the signal contacts 240–255 (e.g., needle 232 connected to signal contact 240, and needle 234 connected to signal contact 248), and at another end electrically connected to one of the bond pads (e.g., 1–16) of the selected IC die (e.g., 100) when testing the selected IC die (e.g., needle 232 making touch contact with bond pad 1, and needle 234 making touch contact with bond pad 9). The load board 222 is conventionally adapted to route each of the test channels 208, power line 210 and ground line 212 to its preassigned bond pads (e.g., one of the bond pad configurations of FIGS. 1B–1D) of the selected IC die by selectively connecting each to an appropriate one of the signal contacts 240–255 of the probe card 224.

The decoupling apparatus 300 includes a nonconductive supporting structure 318, a conductive ground bus 312, a plurality of chip capacitors 304–307 sandwiched between the nonconductive supporting structure 318 and the conductive ground bus 312, and a supporting structure 320 mechanically holding the nonconductive supporting structure 318, the conductive ground bus 312, and the plurality of chip capacitors 304–307 together as well as securely attaching them to the probe card 224. Each of the chip capacitors 304–307 is positioned directly over a corresponding one of the signal contacts 240–255 associated with either a power or ground bond pad (e.g., bond pads 1, 5, 9 and 13 according to the bond pad configuration of FIG. 1B). For example in FIGS. 4A and 4B, chip capacitors 304 and 306 are positioned over signal contacts 240 and 248 which are connected to power bond pads 1 and 9 (and are accordingly, referred to herein as "power chip capacitors"), and chip capacitors 305 and 307 are positioned over signal contacts 244 and 252 which are connected to ground bond pads 5 and 13 (and are accordingly, referred to herein as "ground chip capacitors"). Each of the chip capacitors 304–307 thereupon makes electrical contact to its corresponding signal contact (e.g., chip capacitor 304 with signal contact 240, chip capacitor 305 with signal contact 244, chip capacitor 306 with signal contact 248, and chip capacitor 310 with signal contact 252) through conductive contacts, 314, 315, 316 and 317, which respectively extend from their corresponding signal contacts 240, 244, 248 and 252, to their respective chip capacitors 305, 306, 307 and 310 through holes 324, 325 (now shown) and 327 (not shown) formed in the nonconductive supporting structure 318. For example in FIGS. 4A and 4B, power contacts 314 and 316 connect power chip capacitors 304 and 306 to power bond pads 1 and 9 through signal contacts 240 and 248, and ground contacts 315 and 317 connect ground chip capacitors 305 and 307 to ground bond pads 5 and 13 through signal contacts 244 and 252. In the preferred embodiment of the present invention, the nonconductive supporting structure 318 is formed of a mylar material, and the power and ground contacts 314–317 are formed of a chromeric material.

Figure 2A:
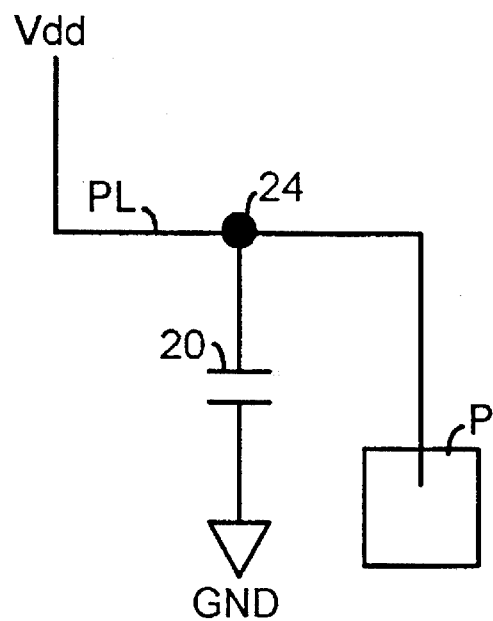
FIGS. 2A and 2B illustrate, as examples, noise reducing circuits including decoupling capacitors connected between a power bond pad and a power source Vdd, and a ground bond pad and a ground line, respectively.
Figure 2B:
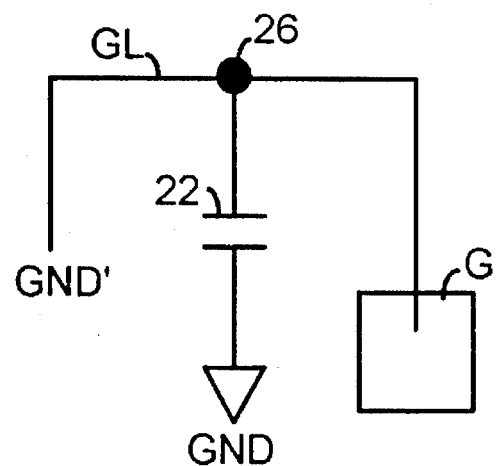

By connecting the conductive ground ring 312 to a ground reference, e.g., GND, the power chip capacitors 304 and 306 then function as the decoupling capacitor 20 in FIG. 2A, and the ground chip capacitors 305 and 307 then function as the decoupling capacitor 22 in FIG. 2B. Such a connection to the ground reference GND may be made by any one of a number of conventional ways including a conductive path formed in the supporting structure 320 connecting the conductive ground bus 312 to a ground contact formed on the probe card 224. By thus positioning the decoupling capacitors 304–307 in close proximity to their respective bond pads 1, 5, 9 and 13, the noise generated on the power line connecting the two (i.e., chip capacitors and bond pads) is minimized.

Alternatively, the decoupling apparatus 300 may be eliminated by placing the chip capacitors directly onto the probe card 224 and forming conductive traces connecting the chip capacitors to a ground contact also formed on the probe card 224. The advantage of such a technique is that the chip capacitors acting as decoupling capacitors can be in even closer proximity to their respective bond pads than is the case with the decoupling apparatus 300, thus minimizing even more the noise generated on the power and ground lines. Counterbalancing such advantage, however, is the high cost of such an approach. For example, either a separate probe card would have to be dedicated for each different power and ground bond pad configuration, or the probe card would have to be modified each time before testing an IC die having a different power and ground bond pad configuration. Such a use of dedicated probe cards is a cost prohibitive approach, however, because probe cards tend to be very expensive. One reason why probe cards are so expensive is because their needle tips must be precisely aligned so that they can make reliable touch contact with closely spaced together bond pads on an integrated circuit die. Modifying the probe card before testing an IC die having a different power and ground bond pad configuration is also highly impractical due to the time consuming effort involved in such an approach, as well as the increased likelihood of misconnections due to human errors.

The use of dedicated decoupling apparatuses, one for each power and ground bond pad configuration, on the other hand, is a very reliable, time efficient, and cost effective approach. Such structures are not only highly economical, but they are also very convenient in quickly adapting the probe card assembly 500 for testing different IC dies having different power and ground bond pad configurations. Inventories of such dedicated decoupling apparatuses are easily maintainable.

Figures 1A, 1B, 1C, 1D:
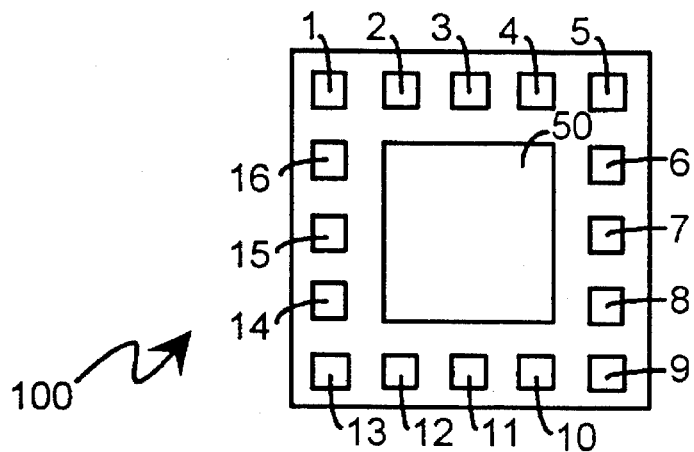
FIG. 1A illustrates, as a simplified example, a top plan view of an integrated circuit die.
FIGS. 1B–1D illustrate, as examples, different power and ground bond pad configurations for the integrated circuit die of FIG. 1A.
Figure 4C:
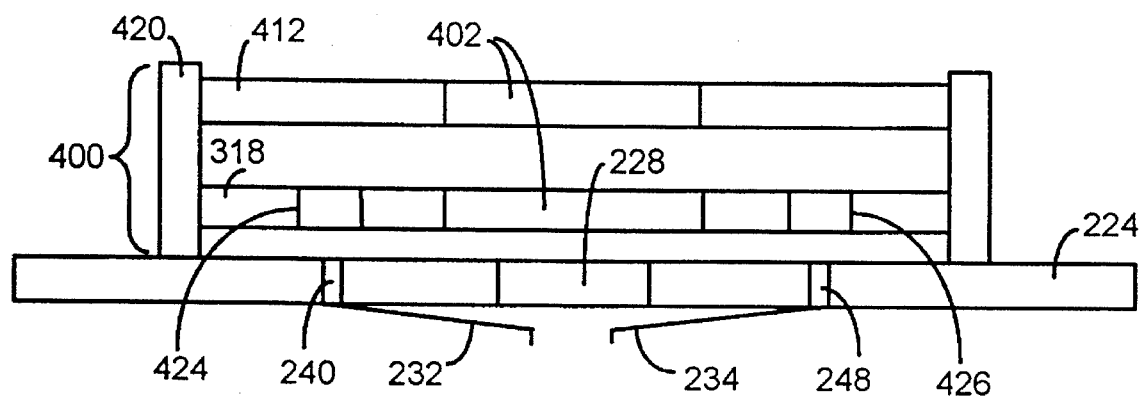
FIGS. 4C and 4D respectfully illustrate, as an example, a cross-sectional view and a top plan view of another adaptable wafer probe assembly utilizing aspects of the present invention.
Figure 4D:
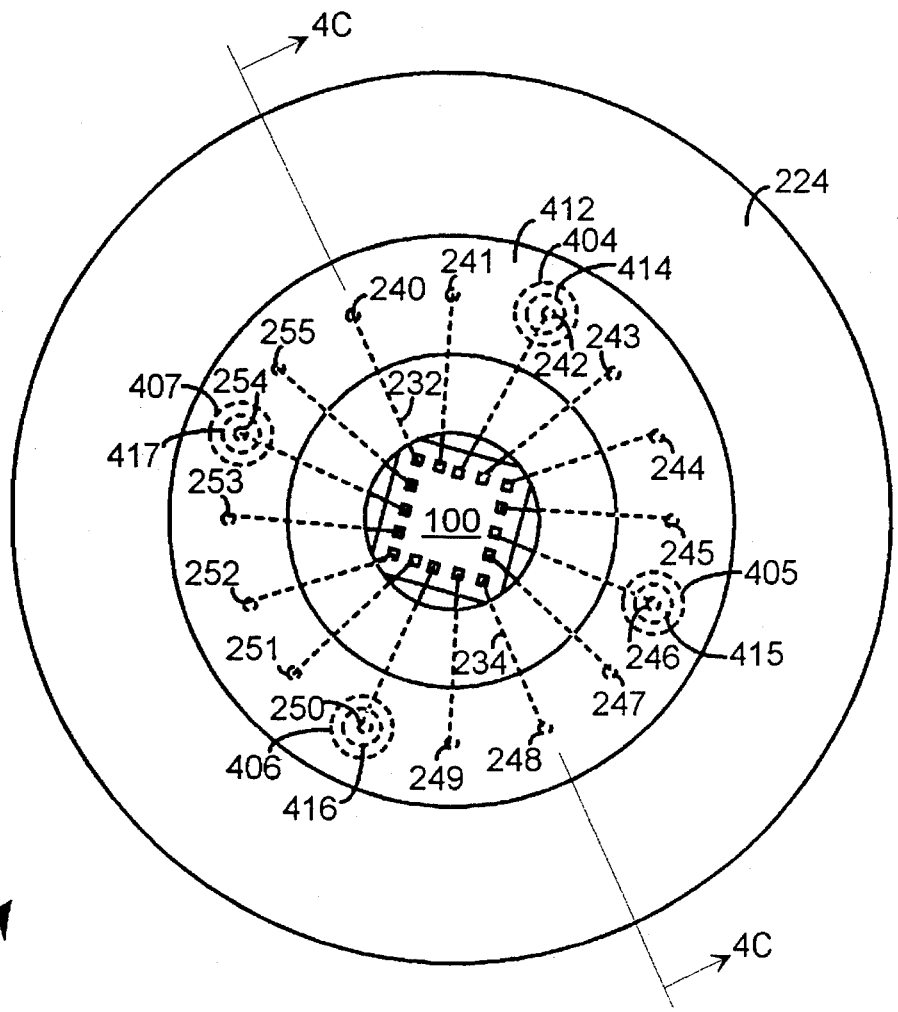

FIGS. 4C and 4D respectively illustrate, as an example, a cross-sectional and top plan view, of a probe card assembly 500 including the probe card 224 and another decoupling apparatus 400 mounted on the probe card 224. Whereas the decoupling apparatus 300 is suitable for testing ICs having bond pad configurations such as depicted in FIGS. 1B and 1C, the decoupling apparatus 400 is suitable for testing ICs having bond pad configurations such as depicted in FIG. 1D. The decoupling apparatus 400 is similarly constructed as the decoupling apparatus 300, except that its chip capacitors 404, 405, 406, and 407 are respectively positioned over the probe card 224 signal contacts 242, 246, 250, and 254 which are in turn, respectively connected to bond pads 3, 7, 11, and 15 of an IC, when the decoupling apparatus 400 is mounted on the probe card 224. In contrast, the chip capacitors 304, 305, 306, and 307 of the decoupling apparatus 300 are respectively positioned over the probe card 224 signal contacts 240, 244, 248, and 252 which are in turn, respectively connected to bond pads 1, 5, 9, and 13 of an IC, when the decoupling apparatus 300 is mounted on the probe card 224.

Referring back to FIG. 3, the probe card assembly 500 is preferably mounted onto the load board 222 such that the decoupling apparatus 300 resides in a hole 230 formed in the center of the load board 222. Holes 226, 230, 302, and 228 are respectively formed in the test head 220, load board 222, decoupling apparatus 300, and probe card 224 such that an optical alignment means 218, such as a microscope, can be used to allow an operator to view the die surface of the wafer 1000 through the properly aligned holes. The IC die to be tested can then be maneuvered into the proper position by the operator manipulating the x-, y- and z-coordinate controls of the X-Y-Z table 236 so that the needle tips of the plurality of needles (e.g., 232 and 234) are brought into touch contact with their associated bond pads (e.g., 1–16) of the selected IC die (e.g., 100) to be tested, by the operator maneuvering the X-Y-Z table 236 towards the test head assembly 201 in a conventional fashion.

Although the various aspects of the present invention have been described with respect to a preferred embodiment, it will be understood that the invention is entitled to full protection within the full scope of the appended claims.

What is claimed is:

1. A probe card assembly useful for testing, in conjunction with an integrated circuit tester having a plurality of test channels, an integrated circuit die having a plurality of bond pads including at least one ground bond pad and at least one power bond pad defining a power and ground bond pad configuration for said integrated circuit die, said probe card assembly comprising:

a probe card having a plurality of needles and a plurality of signal contacts, each needle contacting a respective bond pad of said integrated circuit die, and each signal contact connecting one of said plurality of needles to a corresponding one of said plurality of test channels of said integrated circuit tester, wherein a needle contacting a ground bond pad of said integrated circuit die is referred to as a ground needle, and a signal contact connecting said ground needle to a corresponding one of said plurality of test channels of said integrated circuit tester is referred to as a ground contact; and a decoupling apparatus mounted on said probe card, and configured for the power and ground bond pad configuration of said integrated circuit die, said decoupling apparatus having a ground bus and at least one ground chip capacitor positioned directly over a corresponding ground contact of said probe card such that said ground chip capacitor is connected at one end to said ground bus and at another end through a conductive ground contact, to said corresponding ground contact of said probe card.

2. The probe card assembly as recited in claim 1, wherein a needle contacting a power bond pad of said integrated circuit die is referred to as a power needle, a signal contact connecting said power needle to a corresponding one of said plurality of test channels of said integrated circuit tester is referred to as a power contact, and said decoupling apparatus further has at least one power chip capacitor positioned directly over a corresponding power contact of said probe card such that said power chip capacitor is connected at one end to said ground bus and at another end through a conductive power contact, to said corresponding power contact of said probe card.

3. The probe card assembly as recited in claim 2, said decoupling apparatus further comprising a nonconductive structure having at least one hole through which a conductive ground contact extends to connect one of said at least one ground chip capacitor to a corresponding ground contact of said probe card, and at least one hole through which a conductive power contact extends to connect one of said at least one power chip capacitor to a corresponding power contact of said probe card.

4. The probe card assembly as recited in claim 3, wherein said ground bus of said decoupling apparatus comprises a conductive structure connected to an isolated ground line, and said at least one ground chip capacitor and said at least one power chip capacitor of said decoupling apparatus are sandwiched in between said conductive structure and said nonconductive structure of said decoupling apparatus.

5. The probe card assembly as recited in claim 3, wherein said nonconductive structure of said decoupling apparatus comprises a mylar material, and said conductive ground contact and said conductive power contact of said decoupling apparatus comprise a chromeric material.

6. The probe card assembly as recited in claim 4, wherein said conductive and nonconductive structures of said decoupling apparatus are doughnut shaped with said plurality of needles of said probe card lying in the hole area of such doughnut shaped conductive and nonconductive structures when testing said integrated circuit die.

7. The probe card assembly as recited in claim 1, said decoupling apparatus further comprising means for attaching the decoupling apparatus to said probe card.

* * * * *